(12) United States Patent
Sundström

(10) Patent No.: US 7,880,652 B2
(45) Date of Patent: Feb. 1, 2011

(54) ADJUSTING A FILTER OF A TIME-CONTINUOUS SIGMA-DELTA CONVERTER

(75) Inventor: Lars Sundström, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 160 days.

(21) Appl. No.: 12/097,242

(22) PCT Filed: Dec. 2, 2006

(86) PCT No.: PCT/EP2006/011589

§ 371 (c)(1),
(2), (4) Date: Oct. 17, 2008

(87) PCT Pub. No.: WO2007/079838

PCT Pub. Date: Jul. 19, 2007

(65) Prior Publication Data

US 2009/0072874 A1    Mar. 19, 2009

Related U.S. Application Data

(60) Provisional application No. 60/754,276, filed on Dec. 29, 2005.

(30) Foreign Application Priority Data

Dec. 22, 2005    (EP)    ................................. 05388114

(51) Int. Cl.
*H03M 1/62*    (2006.01)
(52) U.S. Cl. ........................ 341/139; 341/155
(58) Field of Classification Search ............ 341/143, 341/155, 139
See application file for complete search history.

(56) References Cited

U.S. PATENT DOCUMENTS 5,012,244 A    4/1991    Wellard et al.

(Continued)

FOREIGN PATENT DOCUMENTS

EP    1 569 346 A    8/2005

(Continued)

OTHER PUBLICATIONS

Fraser N.A. et al.: "Stability analysis of multiple-feedback oversampled /spl Sigma/-/spl Delta/ A/D Converter Configurations" Proceedings of 43rd Midwest Symposium on Circuits and Systems, Lansing, MI, Aug. 8-11, 2000, Piscataway, NJ, USA, IEEE, vol. 2, Aug. 8, 2000, pp. 676-679, XP010558596, ISBN: 0-7803-6475-9.

(Continued)

*Primary Examiner*—Peguy JeanPierre
(74) *Attorney, Agent, or Firm*—Potomac Patent Group PLLC

(57) ABSTRACT

This invention relates to adjusting a filter of a time-continuous Sigma-Delta converter arranged to convert an analog input signal ($S_{in}$) to a digital output signal. A control signal indicative of a gain of the filter is provided, and the gain of the filter is adjusted in dependence of the control signal. The control signal is provided from the digital output signal of the Sigma-Delta converter. In this way the performance of the Sigma-Delta converter can be improved in a simple way that requires no or few additional analog components, and the Sigma-Delta converter itself is used to adjust its performance. Using a signal from the digital domain of the Sigma-Delta converter is advantageous in that it is typically easier, faster and more precise to process signals in the digital domain.

27 Claims, 8 Drawing Sheets

U.S. PATENT DOCUMENTS

| | | | |
|---|---|---|---|
| 6,445,320 B1 * | 9/2002 | Noro et al. | 341/139 |
| 7,176,817 B2 * | 2/2007 | Jensen | 341/131 |
| 7,268,715 B2 * | 9/2007 | Guimaraes | 341/143 |
| 7,439,890 B2 * | 10/2008 | Schreier et al. | 341/143 |
| 7,567,192 B2 * | 7/2009 | Colmer | 341/143 |
| 7,605,731 B2 * | 10/2009 | Van Veldhoven | 341/139 |

FOREIGN PATENT DOCUMENTS

| | | |
|---|---|---|
| WO | 2005/099098 A1 | 10/2005 |

OTHER PUBLICATIONS

PCT International Search Report, mailed Apr. 11, 2007, in connection with International Application No. PCT/EP2006/011589.

PCT International Preliminary Report on Patentability, mailed Mar. 27, 2008, in connection with International Application No. PCT/EP2006/011589.

* cited by examiner

ADJUSTING A FILTER OF A TIME-CONTINUOUS SIGMA-DELTA CONVERTER

CROSS-REFERENCE TO RELATED APPLICATIONS

This application claims priority under 35 U.S.C. §119 to European Patent Application No. 05388114.0, filed Dec. 22, 2005, which is hereby incorporated herein by reference in its entirety. This application also claims the benefit of U.S. Provisional Application No. 60/754,276, filed Dec. 29, 2005, which is hereby incorporated herein by reference in its entirety.

TECHNICAL FIELD OF THE INVENTION

The invention relates to a method of adjusting a filter of a time-continuous Sigma-Delta converter arranged to convert an analog input signal to a digital output signal, comprising the steps of generating a control signal indicative of a gain of said filter; and adjusting the gain of said filter in dependence of said control signal. The invention further relates to an arrangement for converting an analog input signal to a digital output signal, a device for generating a control signal indicative of a gain of a filter in a time-continuous Sigma-Delta converter and to a corresponding computer program and computer readable medium.

DESCRIPTION OF RELATED ART

In recent years Sigma-Delta converters have been used successfully in analog-to-digital (AD) converters.

Conventional Nyquist-rate converters are built around a quantizer with a relatively fine resolution typically specified by the number of bits with which the signal is represented, e.g. 8 bits, 12 bits or 16 bits. For example, an AD converter that encodes an analog input to one of 256 discrete values has a resolution of 8 bits, since $2^8=256$.

However, due to the fine-resolution quantizer conventional converters are relatively complex in structure compared to a Sigma-Delta converter. Further improvements of the conventional converter are cumbersome in that, on the one hand, further improvements of the fine resolution of the conventional converters will cause a dramatic increase in the complexity of the converter. Additionally, expensive matching or trimming of components is required. On the other hand, an increased sampling frequency will in general add extra costs to the manufacture of the converter. Conventional Nyquist-rate converters sample an input signal at the Nyquist frequency, however, over-sampling of typically two to 16 times may be applied.

Sigma-Delta converters are less complex in their basic structure than the conventional converters. They are built around a quantizer with a relatively coarse resolution corresponding to typically 1 to 5 bits. This low resolution quantizer can be operated at a greater sampling frequency than the fine resolution quantizer, but at the cost of a larger quantization error i.e. the difference between the input signal and the output signal.

To compensate for the larger quantization error, the Sigma-Delta converter is configured with a feedback loop that effectively results in that quantization noise is shaped in the frequency domain to regions outside the frequency band of interest where the desired signal is located. This is one of the key features of Sigma-Delta converters and is broadly recognized and well understood by the persons skilled in the art of Sigma-Delta converter design. Generally, the Sigma-Delta converter provides lower distortion and lower cost when compared to conventional converters.

The continuous development of CMOS process technology that may be used in Sigma-Delta converters renders increased speed at the expense of decreased maximum supply voltage possible. As far as AD converters are concerned, this means that Sigma-Delta converters have become a more viable choice over traditional Nyquist-rate (NR) converters.

Sigma-Delta converters can be time-discrete Sigma-Delta converters (TD-SDC) or time-continuous Sigma-Delta converters (TC-SDC). The latter provide inherent anti-aliasing, which is not the case for time-discrete Sigma-Delta converters (TD-SDC). Furthermore, the theoretical limit on the clock frequency of a time-continuous Sigma-Delta converter is much higher than that of a time-discrete Sigma-Delta converter. The invention presented below applies to time-continuous Sigma-Delta converters.

The described Sigma-Delta converters are typically used in receivers for radio signals, such as OFDM (orthogonal frequency division multiplex) signals, and applications may include mobile phone systems, TV broadcast systems, etc. Specifically, DVB-T (digital video broadcasting terrestrial), DAB (digital audio broadcasting) and WLAN (Wireless Local Area Network) can be mentioned.

The analog integrators/filters in time-discrete Sigma-Delta converters are accurate as their behaviour is controlled by capacitor ratios and clock frequency. The latter is always very accurate and the former is accurate to within 1% or even less (assuming that the Sigma-Delta converter is fabricated on a single chip). This is far better than required not to jeopardize the performance in terms of dynamic range and stability. However, for time-continuous Sigma-Delta converters the behaviour of the integrators/filters, e.g. the gain-bandwidth product (GBP) of an integrator, depends on the absolute accuracy of resistors and capacitors in the integrators/filters, both of which are very inaccurate. Typically, the values of such components may vary ±50%. If the gain-bandwidth product of an integrator also varies with ±50% or more (as it relies on two independent types of components), the Sigma-Delta converter may fail to function completely or at least perform far below optimal performance with respect to dynamic range and maximum stable amplitude.

All in all, time-continuous Sigma-Delta converters provide several advantages over time-discrete Sigma-Delta converters as discussed above. However, a major drawback is the sensitivity with respect to variability of parameters of the integrators/filters, which might significantly reduce the performance of the Sigma-Delta converter or even make it non-functional.

A possible solution to this problem could be based on techniques used for tuning of analog filters, where an oscillator based on the same critical components as in the filter is tuned to a predefined frequency using a phase locked loop. The tuning of the components in the oscillator could then be copied to the components of the filter. This solution however requires a design that uses many analog components and thus consumes a large chip area.

Therefore, it is an object of the invention to provide a method of adjusting an integrator/filter of a time-continuous Sigma-Delta converter, which reduces the sensitivity with respect to variability of parameters of the integrators/filter and thus improves the performance and stability of time-

SUMMARY

According to the invention the object is achieved in that the method comprises the step of generating a control signal from the digital output signal of the Sigma-Delta converter. By controlling the filter of the time-continuous Sigma-Delta converter by a signal provided from the Sigma-Delta converter's own digital output signal, the performance of the Sigma-Delta converter can be improved in a simple way that requires no or few additional analog components, and the Sigma-Delta converter itself is used to adjust its performance. Using a signal from the digital domain of the Sigma-Delta converter to provide the control signal is advantageous in that it is typically easier, faster and more precise to process signals in the digital domain. Moreover, the Sigma-Delta converter is already arranged to generate the analog-to-digital converted output signal; therefore no additional processing power or circuitry is necessary in the Sigma-Delta converter to provide the control signal.

According to an aspect of the invention, the step of generating a control signal further comprises the step of counting consecutive equal samples in the output signal from said Sigma-Delta converter. In one embodiment, this step further comprises the steps of detecting the number (hold length count HLC) of times a specific number (hold length) of consecutive equal samples in the output signal from said Sigma-Delta converter is counted during a given measurement interval; and providing said detected number of times as the control signal indicative of the gain of said filter. Thus, instead of measuring the gain of the filter(s) of the Sigma-Delta converter directly, the digital output from the Sigma-Delta converter is analysed by recording the hold length count for a specific hold length. For a given Sigma-Delta converter topology and measurement interval an optimal filter gain corresponds to a given optimal hold length count ($HLC_0$), i.e. the number of events where a certain hold length is recorded over the measurement interval. If the hold length count deviates more than a predefined value from $HLC_0$, the gain of the filter can be adjusted accordingly.

According to yet another aspect of the invention, the specific number of consecutive equal samples in the output signal from said Sigma-Delta converter equals one. Typically, the hold length count for hold lengths 1, 2, 3 and 4 can be used, because these values of the hold length have been shown to provide a useful sensitivity in the region of the optimal gain for the filters in a second order Sigma-Delta converter. However, the hold length count for hold length HL=1 appears to be the best measure to estimate the gain deviation. The reasons for this are firstly that the hold length count for hold length HL=1 is a monotonic function of gain deviation and secondly that it provides the highest sensitivity around the optimal gain.

According to another aspect of the invention, the method further comprises the step of adding a DC component to the analog input signal prior to its conversion in the Sigma-Delta converter. The addition of a DC signal (or a known varying signal) to the signal input to the Sigma-Delta converter has turned out to improve the behaviour of the hold length count, especially at small input signal levels. The level of the DC signal or the known varying signal is not critical as long as it is set within the range for which the hold length count is independent of input signal level.

In one embodiment, the step of adjusting the gain of the filter comprises the steps of comparing said control signal with a reference value; and adjusting the gain of the filter by a predefined change of gain, such that said gain is increased by said predefined change of gain if the control signal exceeds the reference value and is otherwise decreased by said predefined change of gain. This provides a method of adjusting the gain of the filter of the Sigma-Delta converter by very simple means.

Alternatively, the step of adjusting the gain of said filter may comprise the steps of calculating a difference between said control signal and a reference value; calculating a gain error by multiplying said difference by a first factor derived from a relation between said control signal and the gain of said filter; calculating a new gain value by subtracting said gain error multiplied by a second factor from a previous gain value, where said second factor is less than or equal to one; and adjusting the gain of said filter to said new gain value. In this way the gain of the filter of the Sigma-Delta converter can be adjusted in an optimal way.

According to yet another aspect of the invention, wherein the Sigma-Delta converter comprises multiple filters, the method may further comprise the step of adjusting the gain of each filter in dependence of said control signal. Thus each filter in the Sigma-Delta converter may be adjusted with the same amount of tuning. This is advantageous, in that the relative error between component values, viz. the mismatch, is always very small and therefore the integrators/filters within a Sigma-Delta converter can be adjusted by the same amount, i.e. by means of the same correction signal. Moreover, if a chip comprises more than one Sigma-Delta converter residing thereon, it can be advantageous to adjust the filters in all Sigma-Delta converters by means of the same correction signal.

When the Sigma-Delta converter and other building blocks are integrated on a common chip, the method may further comprise the step of adjusting at least one of said other building blocks in dependence of said control signal. Components, such as resistors, capacitors, and gain stages, causing component value spread in the filters of the Sigma-Delta converter are typically also used in other building blocks like analog filters and oscillators, and therefore the correction applied to the Sigma-Delta converter can also be applied to other building blocks when the components in these other building blocks track those in the Sigma-Delta converter, which is usually the case when these blocks are integrated on the same chip.

In further aspects of the invention, the step of adjusting the gain of the filter may be performed at power-on of said Sigma-Delta converter and/or at pre-defined time instances, where the step does not interfere with normal operation of the Sigma-Delta converter. Hereby, it can be ensured that the adjusting of the gain of the filter(s) in the Sigma-Delta converter will not interfere with the normal operation of the Sigma-Delta converter where signals are converted. The creation of the correction signal and thus the adjustment of the gain of the filter(s) in the Sigma-Delta converter are applied until the measured hold length count is in a predetermined range.

As mentioned, the invention also relates to an arrangement for converting an analog input signal to a digital output signal, comprising a time-continuous Sigma-Delta converter having a filter; means for generating a control signal indicative of a gain of said filter; and means for adjusting the gain of said filter in dependence of said control signal. When the arrangement is adapted to generate said control signal from the digital output signal of said Sigma-Delta converter, the performance of the Sigma-Delta converter can be improved in a simple way that requires no or few additional analog components, and the Sigma-Delta converter itself can be used to adjust its performance. Using a signal from the digital domain of the Sigma-Delta converter to provide the control signal is advantageous in that it is typically easier, faster and more precise to process signals in the digital domain. Moreover, the Sigma-Delta converter is already arranged to generate the analog-to-digital converted output signal; therefore no additional processing power or circuitry is necessary in the Sigma-Delta converter to provide the control signal.

In one embodiment the time-continuous Sigma-Delta converter may comprise a single-bit AD converter allowing the Sigma-Delta converter to be operated at relatively high sampling frequencies.

According to an aspect of the invention, the means for generating a control signal further comprises means for counting consecutive equal samples in the output signal from said Sigma-Delta converter. In one embodiment, this means further comprises means for detecting the number (hold length count HLC) of times a specific number (hold length) of consecutive equal samples in the output signal from said Sigma-Delta converter is counted during a given measurement interval and providing said detected number of times as the control signal indicative of the gain of said filter. Thus, instead of measuring the gain of the filter(s) of the Sigma-Delta converter directly, the arrangement is adapted to analyse the digital output from the Sigma-Delta converter by recording the hold length count for a specific hold length. For a given Sigma-Delta converter topology and measurement interval an optimal filter gain corresponds to a given optimal hold length count ($HLC_0$), i.e. the number of events where a certain hold length is recorded over the measurement interval. If the hold length count deviates more than a predefined value from $HLC_0$, the gain of the filter can be adjusted accordingly.

According to yet another aspect of the invention, the specific number of consecutive equal samples in the output signal from said Sigma-Delta converter equals one. Typically, the hold length count for hold lengths 1, 2, 3 and 4 can be used, because these values of the hold length have shown to provide a useful sensitivity in the region of the optimal gain for the filters in a second order Sigma-Delta converter. However, the hold length count for hold length HL=1 appears to be the best measure to estimate the gain deviation. The reasons for this are firstly that the hold length count for hold length HL=1 is a monotonic function of gain deviation and secondly that it provides the highest sensitivity around the optimal gain.

According to another aspect of the invention, the arrangement further comprises means for adding a DC component to said analog input signal prior to its conversion in the Sigma-Delta converter. The addition of a DC signal (or a known varying signal) to the signal input to the Sigma-Delta converter has turned out to improve the behaviour of the hold length count, especially at small input signal levels. The level of the DC signal or the known varying signal is not critical as long as it is set within the range for which the hold length count is independent of input signal level.

In one embodiment, the means for adjusting the gain of said filter is arranged to compare said control signal with a reference value; and adjust the gain of said filter by a predefined change of gain, such that said gain is increased by said predefined change of gain if said control signal exceeds said reference value and is otherwise decreased by said predefined change of gain. This provides a very simple arrangement for adjusting the gain of the filter of the Sigma-Delta converter.

Alternatively, the means for adjusting the gain of said filter is arranged to calculate a difference between said control signal and a reference value; calculate a gain error by multiplying said difference by a first factor derived from a relation between said control signal and the gain of said filter; calculate a new gain value by subtracting said gain error multiplied by a second factor from a previous gain value, where said second factor is less than or equal to one; and adjust the gain of said filter to said new gain value. In this way the gain of the filter of the Sigma-Delta converter can be adjusted in an optimal way.

According to yet another aspect of the invention, wherein the Sigma-Delta converter comprises multiple filters, the arrangement may further be adapted to adjust the gain of each filter in dependence of said control signal. Thus each filter in the Sigma-Delta converter may be adjusted with the same amount of tuning. This is advantageous, in that the relative error between component values, viz. the mismatch, is always very small and therefore the integrators/filters within a Sigma-Delta converter can be adjusted by the same amount, i.e. by means of the same correction signal. Moreover, if a chip comprises more than one Sigma-Delta converter residing thereon, it can be advantageous to adjust the filters in all Sigma-Delta converters by means of the same correction signal.

When the Sigma-Delta converter and other building blocks are integrated on a common chip, the arrangement may further be adapted to adjust at least one of said other building blocks in dependence of said control signal. Components, such as resistors, capacitors, and gain stages, causing component value spread in the filters of the Sigma-Delta converter are typically also used in other building blocks like analog filters and oscillators, and therefore the correction applied to the Sigma-Delta converter can also be applied to other building blocks when the components in these other building blocks track those in the Sigma-Delta converter, which is usually the case when these blocks are integrated on the same chip.

According to further aspects of the invention, the means for adjusting the gain of said filter may be arranged to adjust the gain at power-on of said Sigma-Delta converter and/or at predefined time instances, where the adjustment does not interfere with normal operation of said Sigma-Delta converter. Hereby, it can be ensured that the adjusting of the gain of the filter(s) in the Sigma-Delta converter will not interfere with the normal operation of the Sigma-Delta converter where signals are converted. The creation of the correaction signal and thus the adjustment of the gain of the filter(s) in the Sigma-Delta converter are applied until the measured hold length count is in a pre-determined range.

The arrangement may further comprise circuitry for receiving radio signals. These radio signals can be OFDM (orthogonal frequency division multiplex) signals, and applications may include mobile phone systems, TV broadcast systems, etc. Specifically, DVB-T (digital video broadcasting terrestrial), DAB (digital audio broadcasting) and WLAN (Wireless Local Area Network) can be mentioned.

The invention also relates to a wireless communications device comprising the arrangement for converting an analog input signal to a digital output signal as described above.

As mentioned, the invention also relates to a device for generating a control signal indicative of a gain of a filter in a time-continuous Sigma-Delta converter, wherein the device comprises processing means arranged to generate said control signal; and wherein the device is adapted to provide said control signal to means for adjusting the gain of said filter. When the device is adapted to receive a digital output signal of said Sigma-Delta converter and generate said control signal from the received digital output signal, the performance of the Sigma-Delta converter can be improved in a simple way that requires no or few additional analog components, and the Sigma-Delta converter itself can be used to adjust its performance. Using a signal from the digital domain of the Sigma-Delta converter to provide the control signal is advantageous in that it is typically easier, faster and more precise to process signals in the digital domain. Moreover, the Sigma-Delta converter is already arranged to generate the analog-to-digital converted output signal; therefore no additional processing power or circuitry is necessary in the Sigma-Delta converter to provide the control signal.

According to an aspect of the invention, the device further comprises means for counting consecutive equal samples in the output signal from said Sigma-Delta converter. In one embodiment, the device further comprises means for detecting the number (hold length count HLC) of times a specific number (hold length) of consecutive equal samples in the output signal from said Sigma-Delta converter is counted during a given measurement interval and providing said detected number of times as the control signal indicative of the gain of said filter. Thus, instead of measuring the gain of the filter(s) of the Sigma-Delta converter directly, the arrangement is adapted to analyse the digital output from the Sigma-Delta converter by recording the hold length count for a specific hold length. For a given Sigma-Delta converter topology and measurement interval an optimal filter gain corresponds to a given optimal hold length count ($HLC_0$), i.e. the number of events where a certain hold length is recorded over the measurement interval. If the hold length count deviates more than a predefined value from $HLC_0$, the gain of the filter can be adjusted accordingly.

According to yet another aspect of the invention, the specific number of consecutive equal samples in the output signal from said Sigma-Delta converter equals one. Typically, the hold length count for hold lengths 1, 2, 3 and 4 can be used, because these values of the hold length have shown to provide a useful sensitivity in the region of the optimal gain for the filters in a second order Sigma-Delta converter. However, the hold length count for hold length HL=1 appears to be the best measure to estimate the gain deviation. The reasons for this are firstly that the hold length count for hold length HL=1 is a monotonic function of gain deviation and secondly that it provides the highest sensitivity around the optimal gain.

The invention also relates to a computer program and a computer readable medium with program code means for performing the method described above.

BRIEF DESCRIPTION OF THE DRAWINGS

The invention will now be described more fully below with reference to the drawings, in which.

DETAILED DESCRIPTION OF EMBODIMENTS

An example of a known, low-pass second order Sigma-Delta converter (SDC) 100 with time-continuous integrators will be described with reference to FIG. 1. It should be noted, that the order of the Sigma-Delta converter indicates the number of integrators in the converter.

Figure 1:
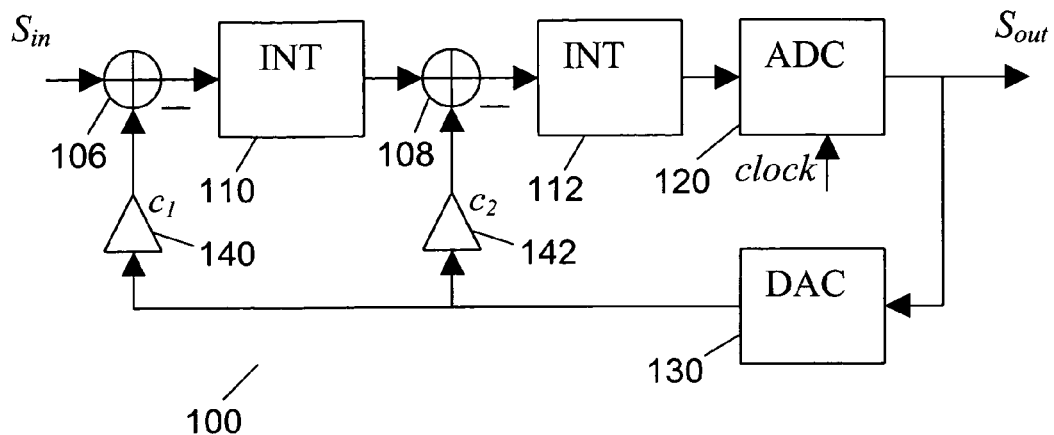
FIG. 1 shows a second-order sigma-delta converter.

The Sigma-Delta converter 100 shown in FIG. 1 is an example of a basic textbook configuration and it should be noted that the invention is not limited to this specific structure, but can be used with any type of time-continuous Sigma-Delta converter with respect to architecture, order, filter characteristics, etc.

In FIG. 1, it is seen that the Sigma-Delta converter 100 comprises two filters 110, 112 in the form of integrators, an analog-to-digital converter (ADC) 120 and a digital-to-analog converter (DAC) 130. The output of the integrator 112 is connected to the input of the analog-to-digital converter 120. Moreover, the Sigma-Delta converter 100 comprises two adders 106, 108, where the input signal $S_{in}$ to the Sigma-Delta converter 100 is input to the adder 106, the output of which is the input to the integrator 110. The other adder 108 is connected between the two integrators 110, 112. The output signal $S_{out}$ from the AD converter 120 is output from the Sigma-Delta converter, but also input to the DA converter 130 of the Sigma-Delta converter to provide a feedback signal to the Sigma-Delta converter. The output from the DA converter 130 is input to two feedback coefficient blocks 140 and 142 providing feedback coefficients $c_1$ and $c_2$, respectively. The feedback coefficients are set to $c_1=c_2=1$ in the described examples. The outputs from the feedback coefficient blocks, 140 and 142, are input to the adders 106 and 108. In the example shown, the integrators 110, 112 in FIG. 1 both have a unity gain at the clock frequency divided by $2\pi$. Furthermore, it is assumed that there is no delay in the AD converter and the DA converter, and that the output of the AD converter is defined by two states [0, 1], while the DA converter maps these states to two output values [−1, +1], thus providing a single bit resolution of the converter.

To demonstrate the behaviour of the Sigma-Delta converter, MATLAB (a well known mathematical program in the form of a commercial "Matrix Laboratory" package which operates as an interactive programming environment) system-level simulations have been carried out based on an OFDM (orthogonal frequency division multiplex) signal that resembles that of a DVB-T (digital video broadcasting—terrestrial) signal with 8192 carriers of which 6817 carriers are active (non-zero) and modulated using 64QAM (Quadrature Amplitude Modulation). The 8192 carrier positions correspond to a 9.14 MHz bandwidth and the sampling frequency of the Sigma-Delta converter is 64 times this frequency, i.e. approximately 585 MHz. The Sigma-Delta converter operates on a baseband component of this signal, i.e. either the I or Q path, and the baseband bandwidth is 9.14/2=4.57 MHz (based on all carrier positions, including non-active carrier positions). However, the nature of the signal used here only serves as an example.

Figure 2:
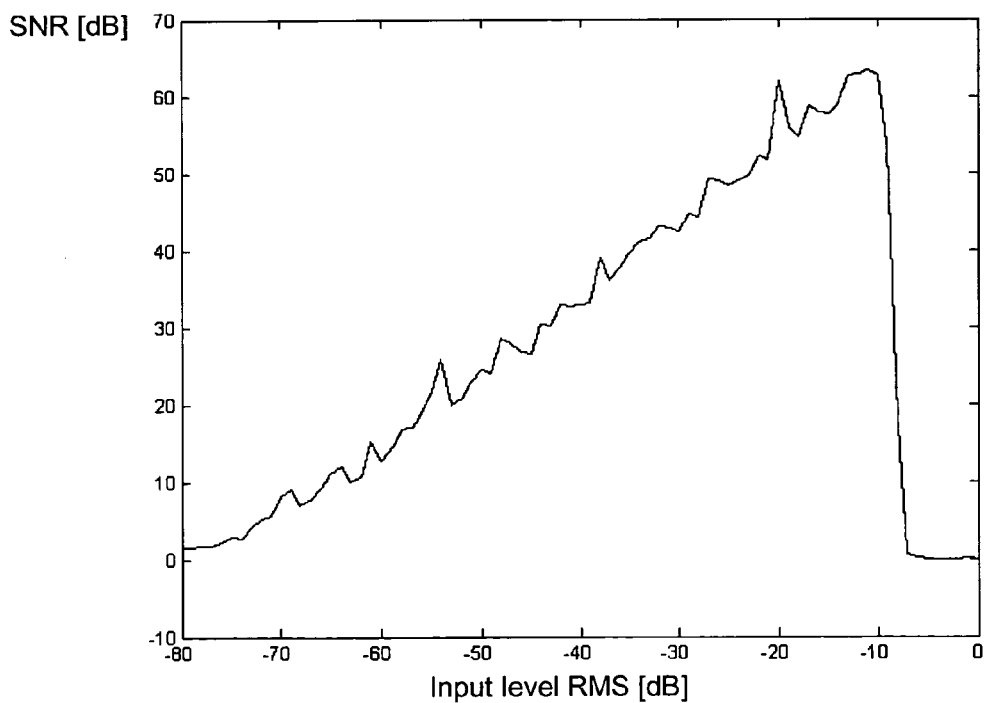
FIG. 2 is a plot of the signal-to-noise ratio (SNR) as a function of OFDM input signal level.

FIG. 2 shows the signal-to-noise ratio (SNR) for the output signal of the Sigma-Delta converter as a function of input RMS (root mean square) level of the total signal given in dB, where 0 dB input corresponds to unity magnitude. The numeric examples given in this specification are all related to the OFDM signal; however, it should be noted that the principles of the invention can be applied to any type of signal.

From FIG. 2 it can be seen that the signal-to-noise ratio increases in a roughly linear fashion up to a certain point where it quickly drops to 0 dB. This is a typical behaviour for Sigma-Delta converters. When the signal reaches levels close to or beyond the DAC output level that is fed back to the first adder in the Sigma-Delta converter, the Sigma-Delta converter cannot track the input signal anymore. This leads to the Sigma-Delta converter becoming overloaded and unstable and possibly the integrators will saturate as well (assumed to have a maximum allowed signal swing in a real implementation). In short, the Sigma-Delta converter will fail completely. The input level, for which this occurs, depends on the characteristics of the input signal. For example, the Sigma-Delta converter would be able to operate for higher input levels (several dB) if the input signal would be a single sinusoid or a single modulated carrier such as a WCDMA signal as the amplitude distribution for such a signal is rather compact with a small peak-to-average ratio (PAR) value.

The early drop for the OFDM signal at about −10 dB is caused by the large PAR value for this type of signal. Every now and then large pulses appear in the OFDM signal that can be very much larger than the RMS level and these can extend beyond the stable input signal range of the Sigma-Delta converter. The result shown in FIG. 2 is based on a single-bit configuration of the AD and DA converters, i.e. the output signal of the Sigma-Delta converter is a series of individual 1s and 0s.

In contrast to time-discrete Sigma-Delta converters, the behaviour of the integrators/filters for time-continuous Sigma-Delta converters, e.g. the gain-bandwidth product (GBP) of an integrator, depends on the absolute accuracy of resistors and capacitors both of which are very inaccurate. In a typical process the values of such components may vary ±50%. If the GBP of an integrator varies with same amount or more (as it relies on two independent types of components) the Sigma-Delta converter may fail to function completely or at least perform far below optimal performance with respect to dynamic range and maximum stable amplitude.

The present invention addresses the need to tune the gain in the analogue integrators/filters of a time-continuous Sigma-Delta converter to reach optimal performance and avoid instability. The gain of the integrator/filters is not measured directly. Instead the digital output stream of the Sigma-Delta converter is analysed, e.g. by recording the hold length count (HLC) for various hold lengths, where hold length (HL) is defined as the number of clock cycles that the Sigma-Delta converter does not change the output signal. For a given Sigma-Delta converter topology and measurement interval the optimal integrator/filter gain corresponds to a given optimal hold length count ($HLC_0$), i.e. the number of events where a certain hold length is recorded over the measurement interval. For example, for HL=1, if the HLC is larger than $HLC_0$ the integrator gain is too small, and correspondingly, if the HLC is less than $HLC_0$ the integrator gain is too large. Thus, this deviation can be used to guide the tuning of the integrator/filter gain.

Figure 3:
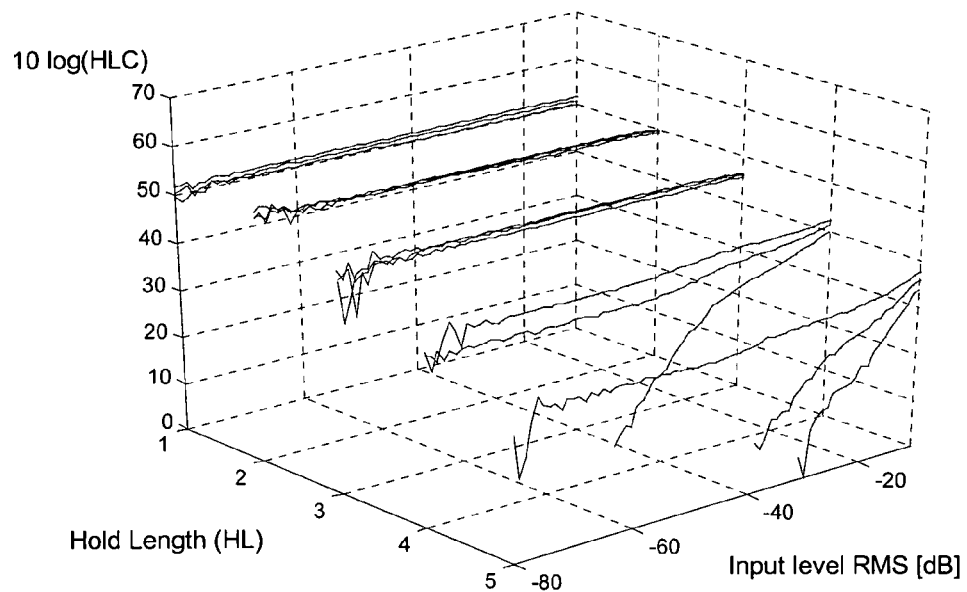
FIG. 3 is a plot of the hold length count HLC for various hold lengths as a function of input signal level.

FIG. 3 is a plot of the hold length count HLC for various hold lengths as a function of input signal level with a logarithmic scale for the hold length count. The invention is based on storing, over a given measurement interval, the number of occurrences where the Sigma-Delta converter keeps the output constant over a given number of samples. For example, the number of occurrences where the Sigma-Delta converter produce a constant output over say three clock cycles (the hold length, HL) before the output is changed is recorded over a sufficiently long measurement interval. As will be shown below the number of such occurrences, i.e. the hold length count HLC, is an accurate, indirect measure of the gain in the integrators/filters given that the input signal strength is not too large or too small.

In FIG. 3 the HLC is shown for various HL as a function of input signal level with a logarithmic scale for HLC. The measurement interval is one OFDM symbol corresponding to 512 k samples from the Sigma-Delta converter. For each hold length there are three curves representing the hold length count for three cases; nominal filter gain $G=G_0$, high filter gain $G=1.1 \cdot G_0$, and low filter gain $G=0.9 \cdot G_0$. In the above, G denotes the gain of each filter in the Sigma-Delta converter and $G_0$ denotes the optimal gain of each filter. It should be noted, that if the Sigma-Delta converter comprises more than one filter, the errors of the filters typically track each other. Thus, if a first filter needs to be corrected by e.g. 10%, this correction would also apply for all other filters in the Sigma-Delta converter.

From FIG. 3 it can be seen that for hold lengths HL=1, 2 and 3 it is difficult to distinguish the three curves for each hold length from each other on a logarithmic scale. Moreover, it can be seen that the three curves all appear to be virtually independent of the input signal level. For HL higher than 3, the hold length count HLC not only varies with gain but also with the input signal level. Therefore, it would be advantageous for the configuration used in the example, to employ the hold length counts for HL=1, 2 or 3 as a measure to detect gain error.

It should be noted that the frequency dependent gain or transfer function H(f) of a filter in a Sigma-Delta converter can be defined by the product of the frequency independent gain G and the frequency dependent transfer function $H_0(f)$ of the filter, i.e.:

$$H(f) = G \cdot H_0(f).$$

where H(f) denotes the actual transfer function of the filter as a function of the frequency f; $H_0(f)$ denotes the optimal transfer function of the filter for the frequency f, and G denotes the frequency independent gain of the filter.

In the case where the filter is an integrator, the relationship between the gain and transfer function of the integrator can be defined as:

$$H_{int}(f) = \frac{G}{j2\pi f}$$

where $H_{int}(f)$ denotes the transfer function of the integrator as a function of the frequency. For the Sigma-Delta converter used throughout this example (see FIG. 1), the optimal gain $G_0$ should equal the clock frequency of the Sigma-Delta converter, i.e. $f_{clock}$, that translates to a transfer function magnitude of $1/(2\pi)$ at the clock frequency.

Figure 4:
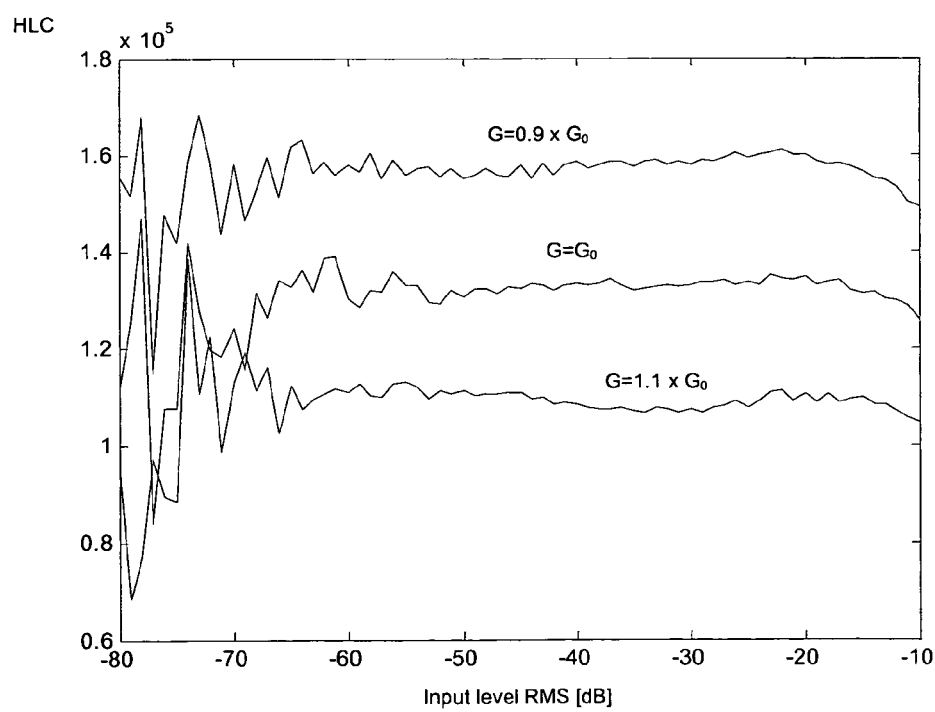
FIG. 4 is a plot of the HLC for HL=1 as a function of input signal level.

FIG. 4 is a plot of the hold length count HLC, in which a linear scale is used for HLC, for HL=1 as a function of input signal level. Again, the three curves correspond to a Sigma-Delta converter with an excess gain of 10%, a Sigma-Delta converter with a gain 10% below the optimal and a Sigma-Delta converter with optimal gain, respectively. From FIG. 4 it can be seen that HLC is independent of the input signal level up to about −20 dB. For low input levels, i.e. below approximately −65 dB, the HLC becomes inaccurate. Increasing the measurement interval, however, would improve the accuracy.

Figure 5:
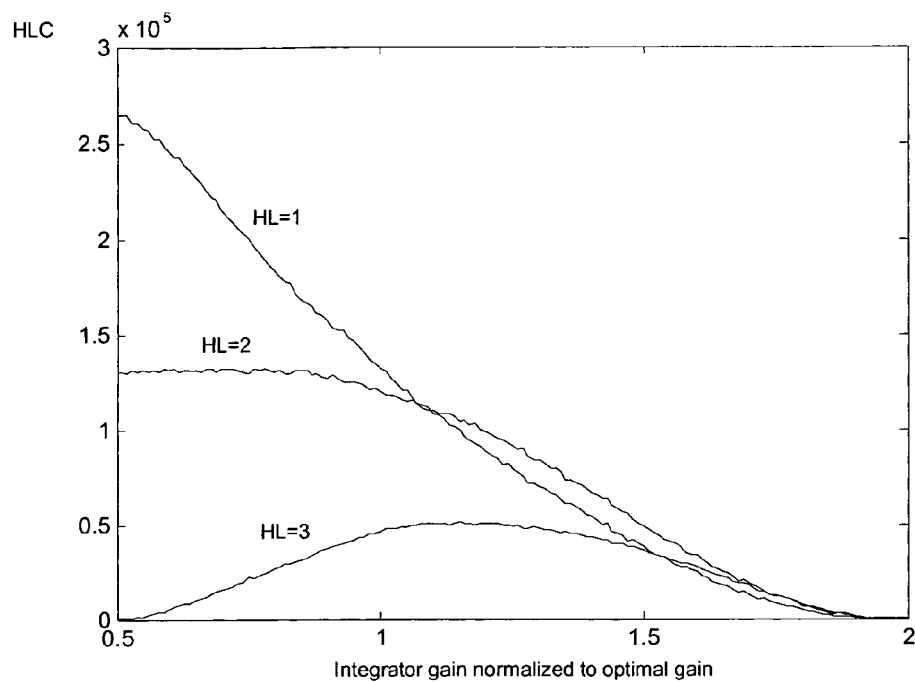
FIG. 5 is a plot of the HLC for hold lengths 1, 2 and 3 as a function of integrator gain deviation for an input signal level at −40 dB.

FIG. 5 is a plot of the HLC for hold lengths 1, 2 and 3 as a function of gain deviation from the optimal integrator/filter gain. The plot is made for an input signal level at −40 dB. From FIG. 5 it can be seen that the hold length count (HLC) is an accurate, indirect measure of the gain in the integrators/filters. The wording "indirect" is used in that the HLC is not proportional to the gain error, as it can be seen from FIG. 5. From FIG. 5 it can moreover be seen that HLC for a hold length of 1 appear to be the best measure to estimate the gain deviation. This is due to the facts that the HLC is a monotonic function of the gain deviation for the hold length of 1 and that the curve for the hold length of 1 provides the highest sensitivity around the optimal gain $G_0$, i.e. for the normalized integrator gain value of 1 in FIG. 5. However, it can be seen from FIG. 5 that also the hold lengths 2 and 3 could be used for providing an estimate of the gain deviation.

From FIGS. 3 and 4 it can be seen that the HLC is fluctuating for small input signal levels. Thus, the HLC is not as useful a measure of the gain for these small input signal levels as for input signal levels above approximately −65 dB. However, it has turned out that if a DC signal or a known varying signal is added to the signal input to the Sigma-Delta converter in addition to the actual signal, the behaviour is improved substantially for these low input signal levels. This can be seen from FIGS. 6 to 8, which are plots corresponding to FIGS. 3 to 5, respectively, but with a DC signal added to the input signal. The DC signal in the example shown in the Figures is set to −30 dB or 0.0316. However, the level of the DC signal is not critical if it is set within the range for which the HLC is independent of the input signal level. When comparing FIG. 7 and the corresponding FIG. 4 (without the DC signal), it can be seen that actual HLC levels are not affected by the introduction of the DC signal. From FIG. 7 it can be seen that for all input levels shown, the HLC is quite stable; therefore, HLC can be employed as a useful measure of the gain for all input levels shown, when a DC signal or a known varying signal is added to the input signal.

Figure 6:
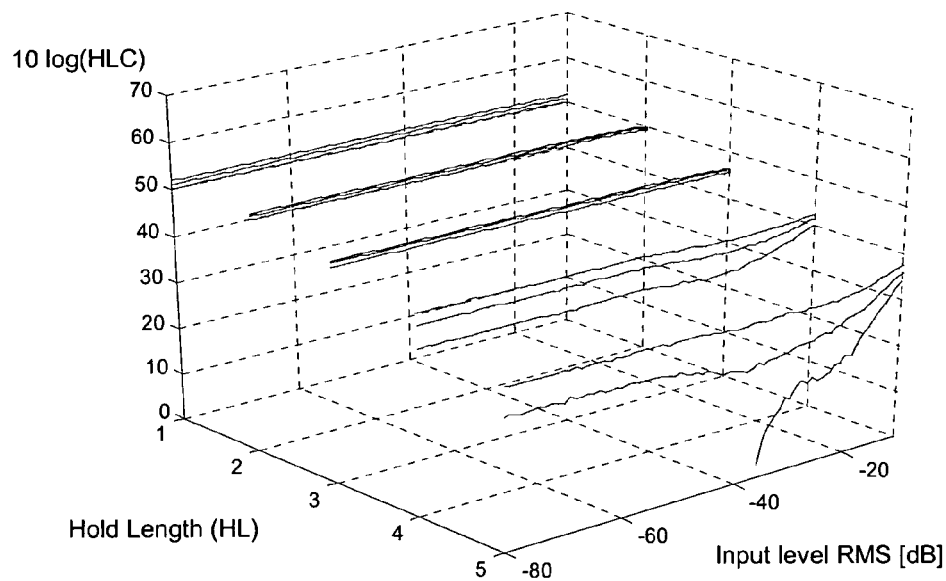
FIGS. 6 to 8 are plots corresponding to FIGS. 3 to 5, respectively, but with a DC signal added to the input signal.

From FIG. 6 it can be seen that the HLC for the hold lengths 1, 2 and 3 is more stable for smaller input levels when a DC signal has been added to the input signal to the Sigma-Delta converter compared with FIG. 3. Moreover, it can be seen that the HLC for the hold length of 4 is considerable more stable in FIG. 6 than in FIG. 3. Thus, with the addition of the DC signal, the hold length of 4 could be useful for providing information on the optimal gain of the filter/integrator in the Sigma-Delta converter. This conclusion is also apparent from FIG. 8, which shows HLC for the hold lengths 1, 2, 3 and 4, where a DC signal has been added to the signal input to the Sigma-Delta converter.

Figure 7:
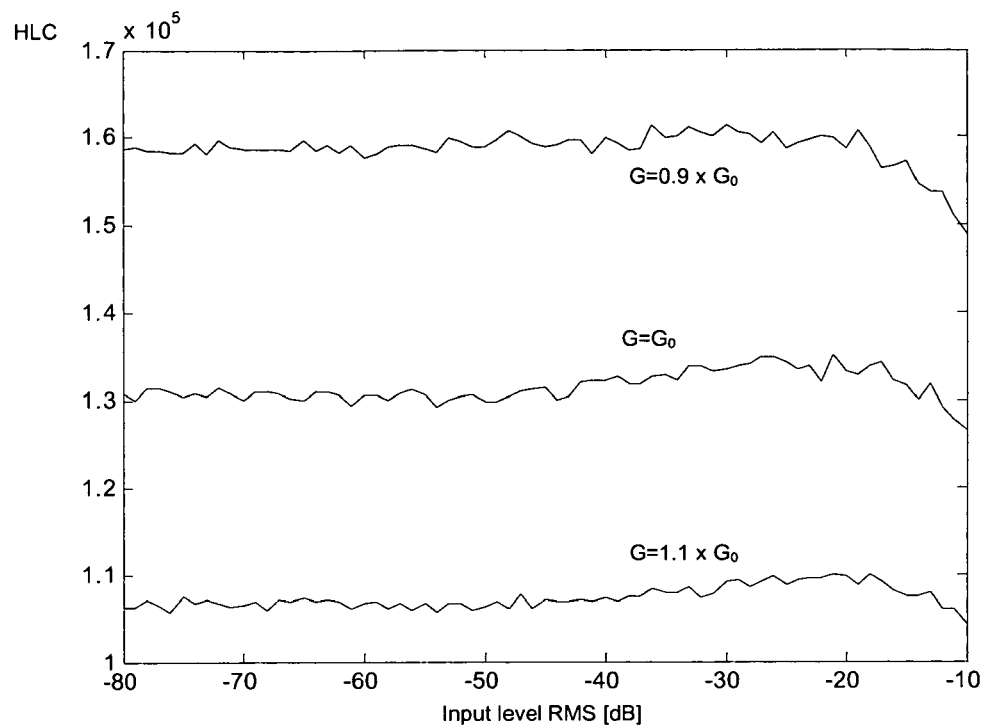
Figure 8:
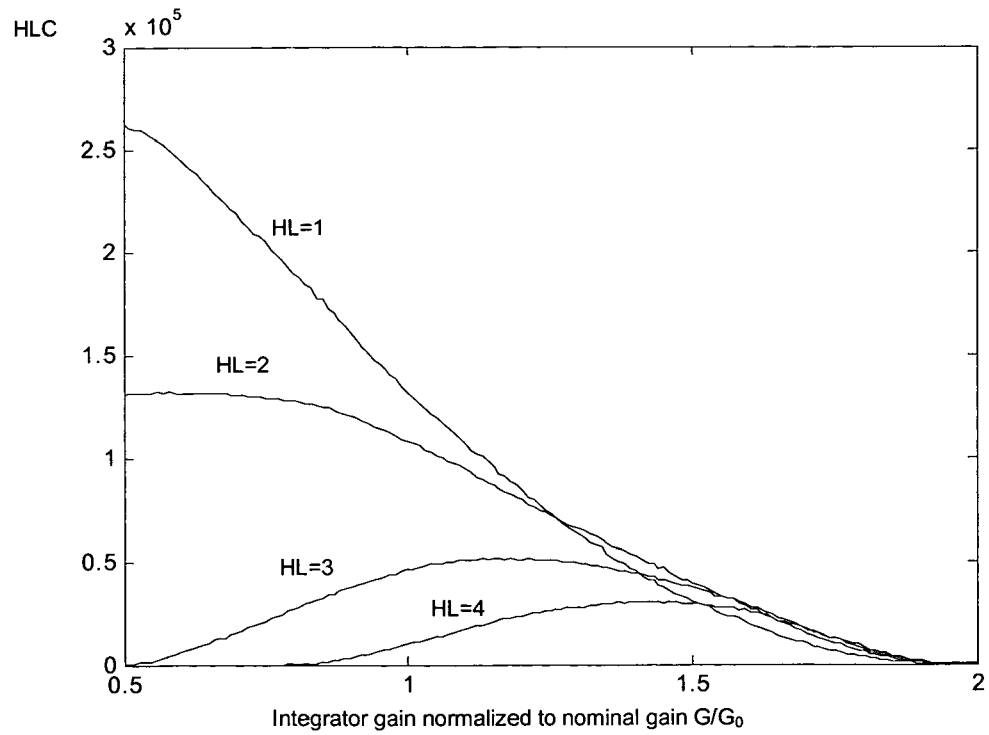

From FIGS. 6 to 8 it can be seen that it is advantageous if a DC signal or a known varying signal, or possibly both, is added to the signal input to the Sigma-Delta converter during adjustment of the gain of the filter(s) in the Sigma-Delta converter. However, it should be noted that the total level at the input of the Sigma-Delta converter should lie within the range where the HLC is accurate and substantially independent of the input signal level for the HLC to provide an accurate estimate of the gain of the filter(s) in the Sigma-Delta converter.

Figure 9:
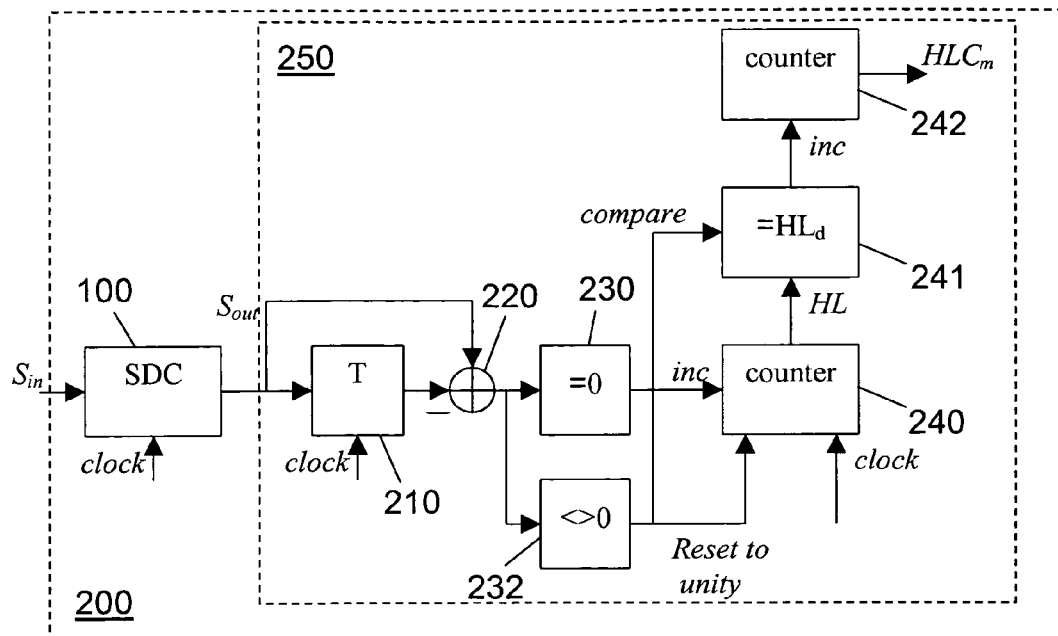
FIG. 9 is a schematic diagram of a time-continuous Sigma-Delta converter and means for HLC detection.

FIG. 9 is a schematic diagram of a circuit 200 comprising a time-continuous Sigma-Delta converter 100, e.g. the Sigma-Delta converter 100 in FIG. 1 or a Sigma-Delta converter of another order and/or configuration, and additional means 250 for registering the hold length count HLC. The means 250 comprises the means 210, 220, 230, 232, 240, 241, 242 connected downstream of the Sigma-Delta converter 100.

The output sample from the Sigma-Delta converter 100 (in FIG. 9) at one time instance is compared, by subtraction in an adder 220, with the previous sample, which has been delayed one clock period by use of a one-clock-period delay element (T) 210. Hereby, a change in the Sigma-Delta converter output, $S_{out}$, can be detected.

A counter 242 is used to measure the HLC of a selected or desired hold length $HL_d$. When a change of output from the Sigma-Delta converter is detected this counter should be incremented by 1 if the most recent HL is equal to the desired hold length, $HL_d$.

A counter 240 is used to measure the hold length, HL. Thus, this counter should start counting from 1 (one) and be incremented by 1 for every sample that is the same as its previous sample. When a change of Sigma-Delta converter output is detected the counter 240 contains the most recent hold length.

Block 230 generates an active signal whenever the current sample and its previous sample are identical. This signal is used to increment the counter 240 by 1.

Block 232 generates an active signal whenever the current sample and its previous sample are different. This signal is used to trigger a comparison in block 241 of the output of the counter 240 and the desired hold length, $HL_d$. If they are the same, block 241 generates an active signal that is used to increment the counter 242 by 1. The signal from 232 is also used to reset the counter 240 to 1 (one) as a change of the output from the Sigma-Delta converter means that a new HL should be measured.

Figure 13:
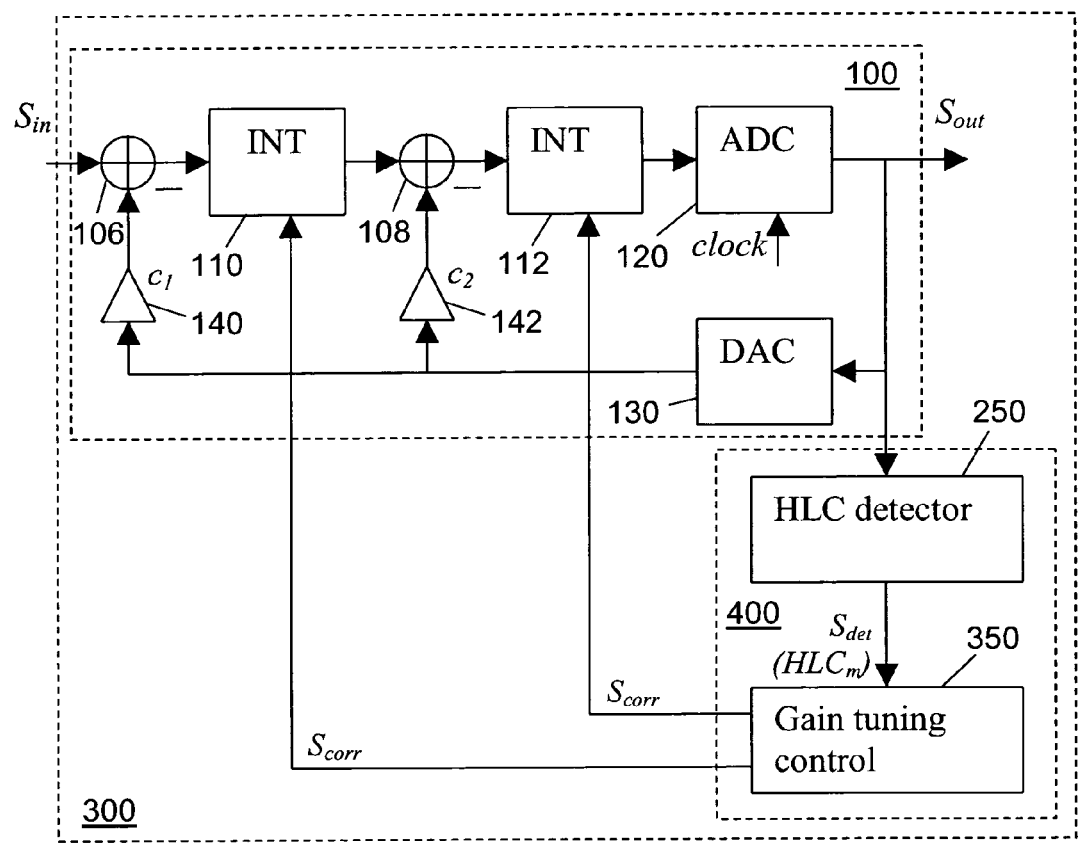
FIG. 13 is a schematic diagram of a time-continuous Sigma-Delta converter in combination with means for HLC detection and means for creating a correction signal.

The output from the counter 242 is the measured hold length count $HLC_m$ (measured over a predetermined number of clock periods), which also forms a control signal that can be input to means for adjusting the gain of the filter(s) in the Sigma-Delta converter, e.g. a means 350 for creating a correction signal, as shown in FIG. 13. The means 350 could be implemented using a CPU with memory or other digital and or analog processing unit with memory.

It should be noted that although FIG. 9 and the description thereof indicate the use of an adder 220, where one of the input signals is subtracted from the other input signal, other means for comparing two single bits for equality exist. One example could be to use an XOR gate that would result in an output of "1" only when the two inputs are different, i.e. when the Sigma-Delta converter changes its output stage. Other alternatives are conceivable, too.

Figure 10:
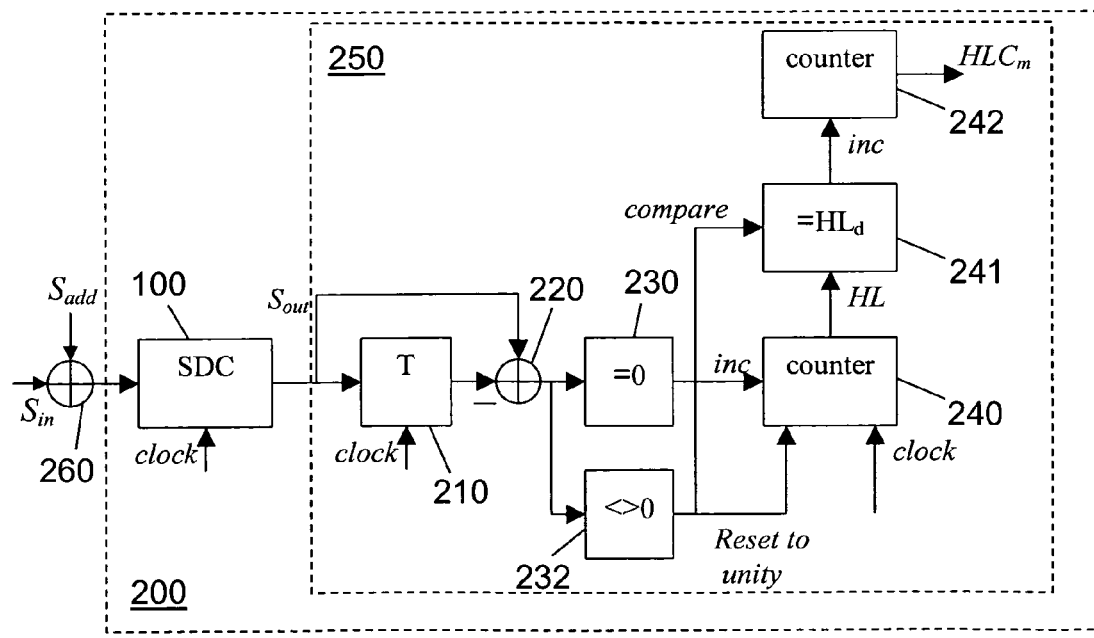
FIG. 10 is a schematic diagram similar to that of FIG. 9, but with a DC signal added to the input of the Sigma-Delta converter.

As mentioned above, the performance of the circuit can be improved by adding a DC signal or a known varying signal to the input signal $S_{in}$ to the Sigma-Delta converter 100. FIG. 10 shows an example of how this can be done. In an adder 260 the signal $S_{add}$, which can be either a DC signal, a known varying signal or a combination thereof, is added to the input signal $S_{in}$, and the combined signal is fed to the input of the Sigma-Delta converter 100. The remaining part of the circuit is identical to that of FIG. 9.

The HLC measure can be used to control the gain of the integrators/filters in the Sigma-Delta converter. Two techniques will be discussed below to serve as examples of how the gain can be tuned. These examples do not exclude the use of other methods for optimisation of the integrator/filter gain. Such methods can be based on well-established computer algorithms or control theory suitable for either analog or digital implementation or both.

Figure 11:
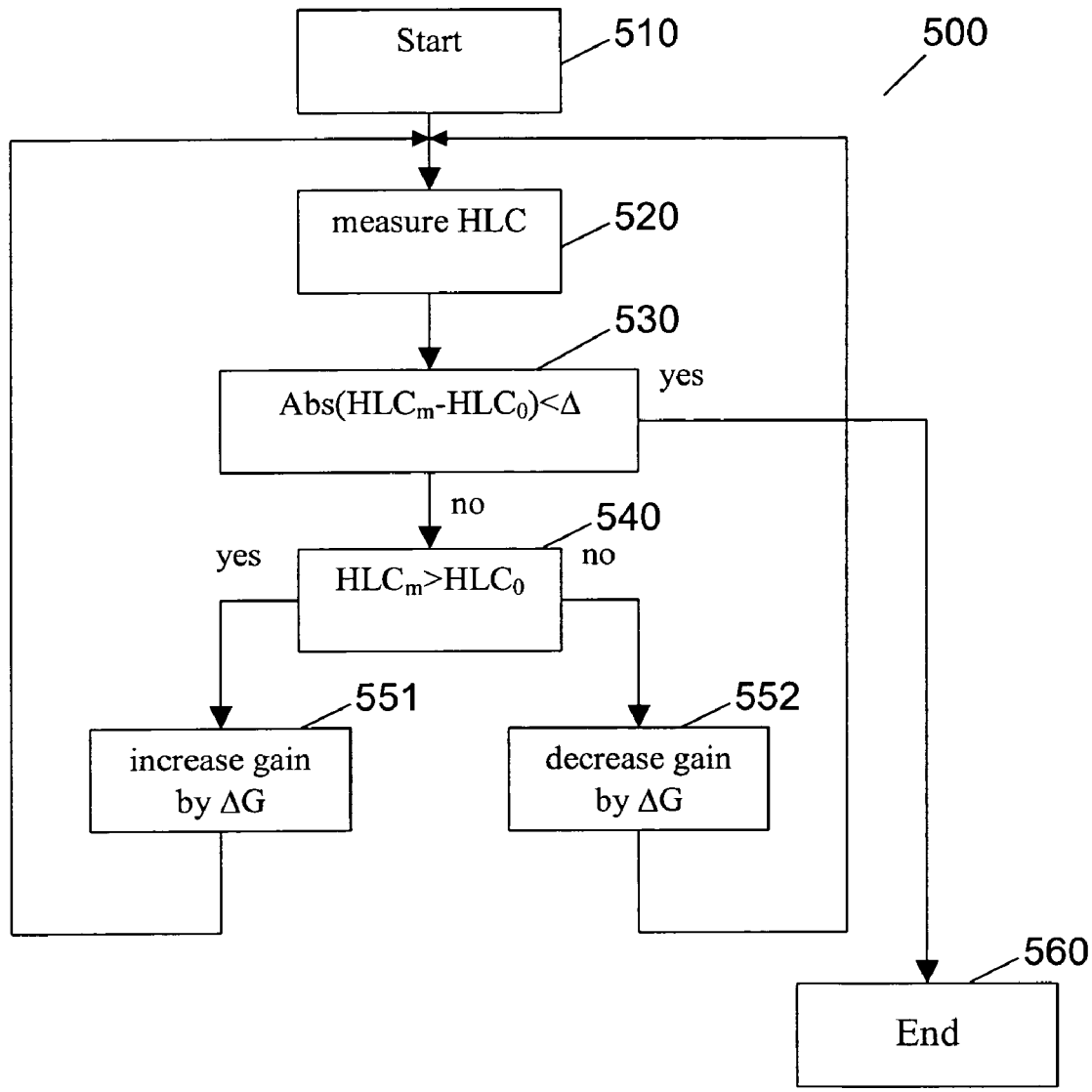
FIG. 11 is a flow chart of a method of adjusting the gain of the filter in a Sigma-Delta converter, based on HLC detection.

In the first example the gain tuning strives towards the optimal gain by very simple means. In FIG. 11 a flow chart is outlined for HL=1. Based on whether the measured HLC ($HLC_m$) is larger or smaller compared with the optimal HLC ($HLC_o$), the gain is increased or decreased, respectively, with a fixed $\Delta G$ and this term could be defined in e.g. linear magnitude, linear power or dB. The magnitude of $\Delta G$ should be chosen large enough to be able to reach the optimal HLC ($HLC_o$) within a predefined amount of time. At the same time it should be sufficiently small to reach as close to the optimal gain as desired.

Thus FIG. 11 shows a flow chart illustrating the steps of a method 500 of adjusting the gain of a filter in a Sigma-Delta converter, based on HLC detection for the hold length HL=1 and a fixed $\Delta G$. The flow is started in step 510 and continues to step 520, in which the Hold Length Count (HLC) is measured, providing the value $HLC_m$ as illustrated in FIG. 9 as a control signal, which below will also be designated as $S_{det}$.

As mentioned below, a termination condition for the gain tuning procedure is needed, and therefore in step 530 the value $HLC_m$ is compared with an optimal hold length count $HLC_0$ by finding the absolute value of the difference between $HLC_m$ and the optimal value $HLC_0$ and comparing this difference with a predefined measure $\Delta$. If it is determined in step 530 that the difference is less than $\Delta$, the flow continues to step 560, where it ends.

If the termination condition is not fulfilled, the flow continues to step 540, in which it is determined whether the measured $HLC_m$ is greater than the optimal value $HLC_0$. In the affirmative case, the flow continues to step 551, where the gain of the filter(s) in the Sigma-Delta converter is increased by a predetermined value $\Delta G$. Alternatively, if it is determined in step 540 that the measured $HLC_m$ is less than the optimal value $HLC_0$, the flow continues to step 552, where the gain of the filter(s) in the Sigma-Delta converter is decreased by the predetermined value $\Delta G$. The optimal hold length count $HLC_0$ is preferably determined by means of a pre-simulation of a Sigma-Delta converter using nominal/optimal gain values.

From step 551 as well as from step 552 the flow returns to step 520, so that the flow is continued until it is determined in step 530 that the absolute value of the difference between the measured hold length count $HLC_m$ and the optimal hold length count $HLC_0$ is less than the predefined measure $\Delta$.

The method described above and illustrated in FIG. 11 serves as a simple but descriptive example of how the gain can be adjusted based on the measured hold length count and the optimal hold length count. In a more general context, the problem is a straightforward optimisation problem for which there are numerous established methods within the field of optimisation theory and methods, from very simple to very complex. Such methods can be used within the scope of this invention to provide both faster and more accurate adjustment of the gain. These optimisation methods often involve changing the step size $\Delta G$.

Step 520 of the method of FIG. 11 is typically carried out in the means 250 for detecting HLC, e.g. the block 250 in FIGS. 9, 10 and 13. Steps 540, 551 and 552 are typically carried out in means 350 for adjusting the gain of a filter in the Sigma-Delta converter as shown in FIG. 13. Thus a control signal $S_{det}$, which is the measured hold length count $HLC_m$, is output from the means 250 for detecting HLC to the means 350 for adjusting the gain of the filter (gain tuning control), so that the means 350 on the basis of this signal, $S_{det}$, can provide a correction signal $S_{corr}$ to be input to the filter(s) of the Sigma-Delta converter for adjusting the gain thereof.

As for the measurement interval over which each HLC measurement is taking place, it should be sufficiently long to obtain an accurate estimate. In particular this applies to the case when there is a random input signal that could result in large variations of HLC, if the measurement interval is too small. FIGS. 4 and 7 demonstrate this very well. The kinks in the curves are due to the fact that the measurement interval is only one OFDM symbol for each configuration. Using more symbols the curves would become much smoother. Typically adjustment of the gain of the filters in the Sigma-Delta converter will take place at power-on of the Sigma-Delta converter and/or at predefined time instances when the adjustment will not interfere with normal operation of the Sigma-Delta converter when signals are converted.

Thus a termination condition is required for the gain tuning and this is also shown in FIG. 11. The gain tuning function is terminated when the measured $HLC_m$ is sufficiently close to the optimal $HLC_0$, i.e. when the difference is within the range $[-\Delta, +\Delta]$.

When $\Delta G$ is fixed, it is preferably set to a value slightly less than the maximum allowed gain error. Thereby it can be assured that the flow chart in FIG. 11 can reach termination. However, choosing a significantly smaller value will provide a more stable gain tuning if the measured HLC is noisy (e.g. due to a small measurement time that makes the HLC measurement less accurate). The maximum allowed gain error can be found for a specific Sigma-Delta converter by simulating the signal-to-noise ratio SNR as a function of the gain error. Based on the maximum degradation of SNR with respect to gain error the span on acceptable gain error is found.

The method 500 provides a very simple tuning of the gain of the filter(s) in a Sigma-Delta converter, as it only relies on the difference/discrepancy between optimal and measured HLC, and based on this the gain of the filter(s) in the Sigma-Delta converter is changed by a fixed step.

Figure 12:
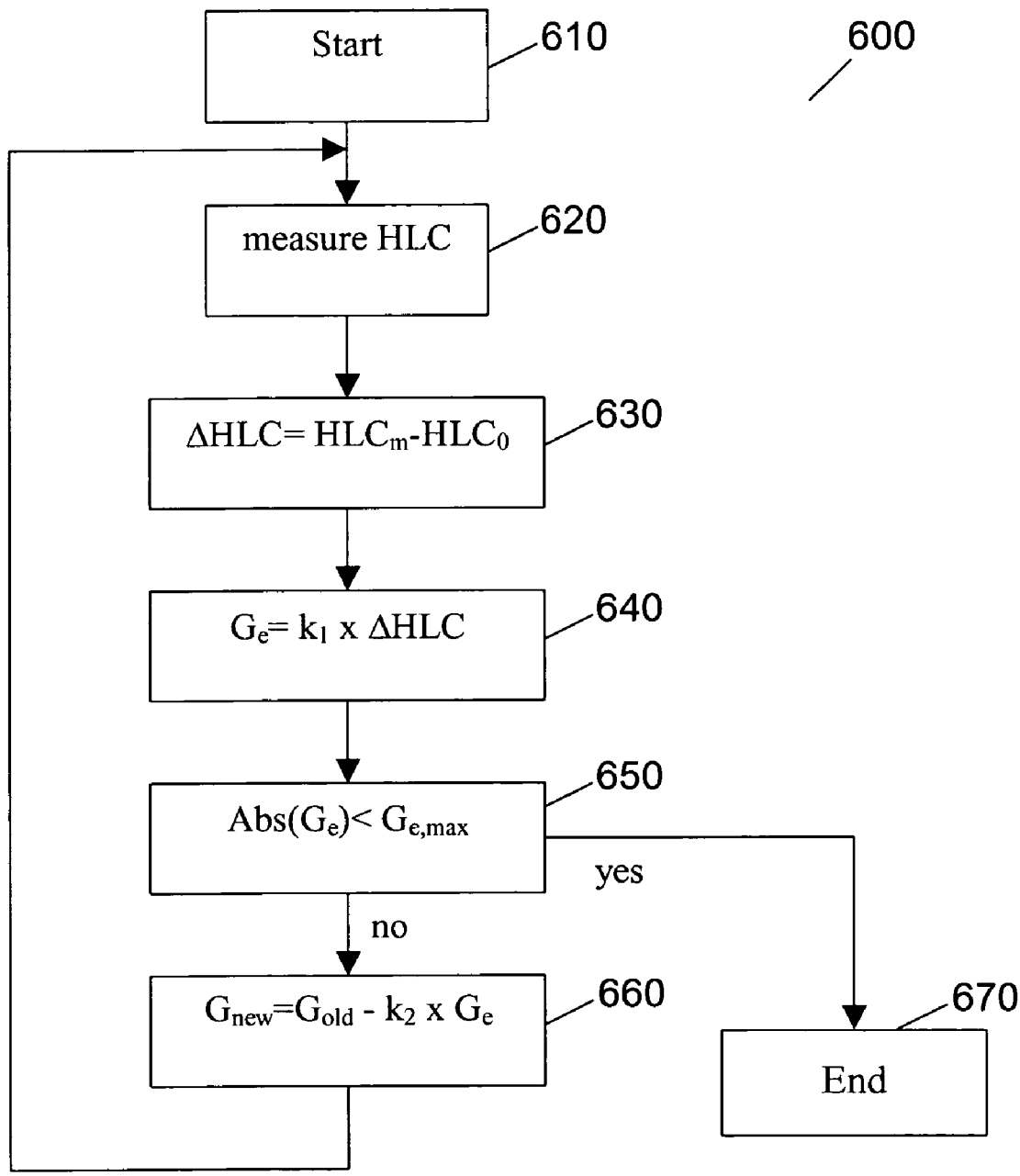
FIG. 12 is a flow chart of an alternative method of adjusting the gain of the filter in a Sigma-Delta converter, based on HLC detection.

In the second example the gain step can be varied based on the difference between the desired gain and estimated gain (based on HLC measurement). A flow chart 600 illustrating gain tuning control based on detection of hold length count for HL=1 and using a variable $\Delta G$ is shown in FIG. 12. The process in the flow chart 600 starts in step 610 and continues in step 620 by measuring HLC for HL=1. In step 630 the difference $\Delta HLC$ between the measured hold length count $HLC_m$ and the desired or optimal hold length count $HLC_0$ is calculated. As this is a measure of the distance to the optimal hold length count and indirectly also to the optimal gain, this value may be used to calculate the gain error $G_e$ as $G_e = k_1 \times \Delta HLC$ in step 640. The factor $k_1$ is the reciprocal of the derivative $\delta HLC(G)/\delta G$, i.e. $k_1 = 1/\delta HLC(G)/\delta G$. A ratio $\Delta HLC/\Delta G$ could also be used to calculate $k_1$. A rough estimate can be found from a plot like that in FIG. 8 for the specific Sigma-Delta converter and hold length considered. Thus such a plot must be generated from calculation, simulation and/or measurements. It can be assumed that the actual gain is in the vicinity of the optimal gain and therefore $k_1$ could be calculated at this point ($G=G_0$).

In step 650 it is checked if the magnitude of the estimated gain error $G_e$ is smaller than the maximum allowed gain error $G_{e,max}$. If this is the case, the gain tuning flow can be terminated in step 670. If, however, the gain error is larger than $G_{e,max}$, the gain needs to be adjusted. The gain can be adjusted directly by $G_e$ as this is the estimated gain error. However, if the measurement of HLC is noisy due to limited measurement time or other reasons, a smoother but slower gain tuning progress is obtained if the gain is adjusted by $k_2 \times G_e$ where $k_2<1$, as shown in step 660 where the new gain value $G_{new}$ is calculated based on the old value and $k_2 \times G_e$.

These two examples are just very simple optimisation schemes to find the solution for the equation $HLC_m(G)-HLC_0=0$, i.e. find the gain G that satisfies the equation. For anyone skilled in the art of optimisation it is readily seen that different and/or more advanced methods can be applied to solve this equation based on requirements to speed, complexity, robustness, and accuracy.

As mentioned, the two flow charts of FIGS. 11 and 12 are both based on detection of the hold length count for the hold length HL=1. It can be seen from FIGS. 5 and 8 that the slopes of the graphs for e.g. HL=1 and HL=3 are different around the point where the normalized gain equals one, i.e. $G=G_0$. This means that when $HLC_m > HLC_0$ the gain has to be increased for HL=1 (as shown in the flow chart of FIG. 11), while it would have to be decreased for HL=3 due to the different slope. For the flow chart of FIG. 12, this difference is taken into account by the calculation of the factor $k_1$.

FIG. 13 is a schematic diagram of a circuit 300 with means 250 for detecting HLC and means 350 for creating a correction signal adapted to adjust the gain of the filter(s) of the Sigma-Delta converter 100.

The circuit 300 in FIG. 13 comprising a time-continuous Sigma-Delta converter 100, e.g. the Sigma-Delta converter 100 in FIG. 1, and additional means 400 for adjusting the gain of the filters 110, 112 in the Sigma-Delta converter. The means 400 comprises means 250 for detecting HLC and means 350 for creating a correction signal adapted to adjust the gain of the filters 110, 112 of the Sigma-Delta converter. From FIG. 13 it can be seen that the digital output $S_{out}$ from the Sigma-Delta converter 100 is input to the means 250 for detecting HLC. The means 250 for detecting HLC provides a signal, $S_{det}$, which equals the measured hold length count $HLC_m$. This signal is input to the means 350 for creating a correction signal $S_{corr}$. This correction signal is subsequently input to the filters 110, 112 of the Sigma-Delta converter 100 for adjusting the gain thereof.

In the circuit of FIG. 13, the same signal $S_{corr}$ is input to both filters 110, 112 of the Sigma-Delta converter 100, as it is a reasonable assumption that the relative difference between component values of different integrators/filters within a Sigma-Delta converter is always very small. Generally, it can be assumed that the integrators/filters within a Sigma-Delta converter or several Sigma-Delta converters residing on the same chip track each other very well as the relative error between component values (mismatch) is always very small. Thus, the gain of all integrators/filters can be tuned with the same amount. As mentioned, the correction of the gain of the integrators/filters of a Sigma-Delta converter is required because of component value spread in e.g. resistors, capacitors, and gain stages. Typically, however, such components are also used in other building blocks like analog filters and oscillators, and therefore it can be concluded that the correction applied to the Sigma-Delta converter can also be applied to other building blocks when the components in these other building blocks track those in the Sigma-Delta converter, which is usually the case when these blocks are integrated on the same chip.

The actual gain tuning of the integrators can be solved in many ways depending on the circuit topology that is used to implement the integrator. Basically, it may involve varying one or more components within the integrator, including resistors, capacitors, and transconductance amplifiers. These can be varied in a continuous fashion or in discrete steps.

It should be recognized that the examples described above and shown in the figures are based on a second order Sigma-Delta converter and that other Sigma-Delta converter solutions with e.g. different order, architecture, low-pass or band-pass type, filter coefficient etc. will be possible, too. It should be stressed that each Sigma-Delta converter solution with respect to order, architecture, etc., will have a unique $HLC_0$ and this value can be obtained from a simulation of the specific Sigma-Delta converter solution. Which hold length to use for gain error detection, where non-ideal effects are accounted for, may vary as well as what the optimal hold length count will be for that particular hold length. Also, the relation between HLC and the input power may differ. Finally, errors introduced in a real implementation including delay in the AD or DA converter, non-linearities, mismatch between signals path, etc., may also affect relations between the quantities defined.

Although a preferred embodiment of the present invention has been described and shown, the invention is not restricted to it, but may also be embodied in other ways within the scope of the subject-matter defined in the following claims.

The invention claimed is:

1. A method of adjusting a filter of a time-continuous Sigma-Delta converter arranged to convert an analog input signal to a digital output signal, wherein the method comprises the steps of:
    generating from the digital output signal of said Sigma-Delta converter a control signal indicative of a gain of said filter; and
    adjusting the gain of said filter in dependence on said control signal,
    wherein the step of generating a control signal further comprises the step of counting consecutive equal samples in the output signal from said Sigma-Delta converter.

2. A method according to claim 1, wherein the step of generating a control signal further comprises the steps of:
    detecting the number of times a specific number of consecutive equal samples in the output signal from said Sigma-Delta converter is counted during a given measurement interval; and
    providing said detected number of times as the control signal indicative of the gain of said filter.

3. A method according to claim 2, wherein said specific number of consecutive equal samples in the output signal from said Sigma-Delta converter equals one.

4. A method according to claim 3, wherein the step of adjusting the gain of said filter comprises the steps of:
    comparing said control signal with a reference value; and
    adjusting the gain of said filter by a predefined change of gain, such that said gain is increased by said predefined change of gain if said control signal exceeds said reference value and is otherwise decreased by said predefined change of gain.

5. A method according to claim 1, wherein the method further comprises the step of adding a DC component to said analog input signal prior to its conversion in the Sigma-Delta converter.

6. A method according to claim 1, wherein said Sigma-Delta converter comprises multiple filters, and the method further comprises the step of adjusting the gain of each filter in dependence on said control signal.

7. A method according to claim 1, wherein said Sigma-Delta converter and other building blocks are integrated on a common chip, and the method further comprises the step of adjusting at least one of said other building blocks in dependence of said control signal.

8. A method according to claim 1, wherein the step of adjusting the gain of said filter is performed at power-on of said Sigma-Delta converter.

9. A method according to claim 1, wherein the step of adjusting the gain of said filter is performed at predefined time instances, when the step of adjusting does not interfere with normal operation of said Sigma-Delta converter.

10. A method of adjusting a filter of a time-continuous Sigma-Delta converter arranged to convert an analog input signal to a digital output signal, wherein the method comprises the steps of:
generating from the digital output signal of said Sigma-Delta converter a control signal indicative of a gain of said filter; and
adjusting the gain of said filter in dependence on said control signal,
wherein the step of adjusting the gain of said filter comprises the steps of:
calculating a difference between said control signal and a reference value;
calculating a gain error by multiplying said difference by a first factor derived from a relation between said control signal and the gain of said filter;
calculating a new gain value by subtracting said gain error multiplied by a second factor from a previous gain value, where said second factor is less than or equal to one; and
adjusting the gain of said filter to said new gain value.

11. An arrangement for converting an analog input signal to a digital output signal, comprising:
a time-continuous Sigma-Delta converter having a filter;
means for generating from the digital output signal of said Sigma-Delta converter a control signal indicative of a gain of said filter; and
means for adjusting the gain of said filter in dependence of said control signal,
wherein the means for generating a control signal further comprises means for counting consecutive equal samples in the output signal from said Sigma-Delta converter.

12. An arrangement according to claim 11, wherein said time-continuous Sigma-Delta converter comprises a single-bit analog-to-digital converter.

13. An arrangement according to claim 11, wherein the means for generating a control signal further comprises means for detecting the number of times a specific number of consecutive equal samples in the output signal from said Sigma-Delta converter is counted during a given measurement interval and providing said detected number of times as the control signal indicative of the gain of said filter.

14. An arrangement according to claim 13, wherein said specific number of consecutive equal samples in the output signal from said Sigma-Delta converter equals one.

15. An arrangement according to claim 11, wherein the arrangement further comprises means for adding a DC component to said analog input signal prior to its conversion in the Sigma-Delta converter.

16. An arrangement according to claim 14, wherein the means for adjusting the gain of said filter is arranged to:
compare said control signal with a reference value; and
adjust the gain of said filter by a predefined change of gain, such that said gain is increased by said predefined change of gain if said control signal exceeds said reference value and is otherwise decreased by said predefined change of gain.

17. An arrangement according to claim 11, wherein said Sigma-Delta converter comprises multiple filters, and the arrangement is further adapted to adjust the gain of each filter in dependence of said control signal.

18. An arrangement according to claim 11, wherein said Sigma-Delta converter and other building blocks are integrated on a common chip, and the arrangement is further adapted to adjust at least one of said other building blocks in dependence of said control signal.

19. An arrangement according to claim 11, wherein the means for adjusting the gain of said filter is arranged to adjust the gain at power-on of said Sigma-Delta converter.

20. An arrangement according to claim 11, wherein the means for adjusting the gain of said filter is arranged to adjust the gain at predefined time instances, when the adjustment does not interfere with normal operation of said Sigma-Delta converter.

21. A wireless communications device comprising the arrangement of claim 11 for converting an analog input signal to a digital output signal.

22. An arrangement for converting an analog input signal to a digital output signal, comprising:
a time-continuous Sigma-Delta converter having a filter;
means for generating from the digital output signal of said Sigma-Delta converter a control signal indicative of a gain of said filter; and
means for adjusting the gain of said filter in dependence of said control signal,
wherein the means for adjusting the gain of said filter is arranged to:
calculate a difference between said control signal and a reference value;
calculate a gain error by multiplying said difference by a first factor derived from a relation between said control signal and the gain of said filter;
calculate a new gain value by subtracting said gain error multiplied by a second factor from a previous gain value, where said second factor is less than or equal to one; and
adjust the gain of said filter to said new gain value.

23. A device for generating a control signal and providing said control signal to means for adjusting a gain of a filter in a time-continuous Sigma-Delta converter, wherein the device comprises processing means arranged to generate said control signal; and the device is adapted to receive a digital output signal of said Sigma-Delta converter and generate said control signal from the received digital output signal,
wherein the device further comprises means for counting consecutive equal samples in the output signal from said Sigma-Delta converter.

24. A device according to claim 23, wherein the device further comprises means for detecting the number of times a specific number of consecutive equal samples in the output signal from said Sigma-Delta converter is counted during a given measurement interval and providing said detected number of times as the control signal indicative of the gain of said filter.

25. A device according to claim 24, wherein said specific number of consecutive equal samples in the output signal from said Sigma-Delta converter equals one.

26. A computer program comprising program code means for performing a method of adjusting a filter of a time-continuous Sigma-Delta converter arranged to convert an analog input signal to a digital output signal when said computer program is run on a computer, the method comprising the steps of:
generating from the digital output signal of said Sigma-Delta converter a control signal indicative of a gain of said filter; and adjusting the gain of said filter in dependence on said control signal, wherein the step of generating a control signal further comprises the step of counting consecutive equal samples in the output signal from said Sigma-Delta converter.

27. A computer readable medium having stored thereon program code means for performing a method of adjusting a filter of a time-continuous Sigma-Delta converter arranged to convert an analog input signal to a digital output signal when said program code means is run on a computer, the method comprising the steps of:

generating from the digital output signal of said Sigma-Delta converter a control signal indicative of a gain of said filter; and adjusting the gain of said filter in dependence on said control signal, wherein the step of generating a control signal further comprises the step of counting consecutive equal samples in the output signal from said Sigma-Delta converter.

\* \* \* \* \*

UNITED STATES PATENT AND TRADEMARK OFFICE
CERTIFICATE OF CORRECTION

| | | |
|---|---|---|
| PATENT NO. | : 7,880,652 B2 | Page 1 of 1 |
| APPLICATION NO. | : 12/097242 | |
| DATED | : February 1, 2011 | |
| INVENTOR(S) | : Sundstrom | |

It is certified that error appears in the above-identified patent and that said Letters Patent is hereby corrected as shown below:

In Column 6, Line 43, delete "correaction" and insert -- correction --, therefor.

In Column 12, Line 7, delete "sampie," and insert -- sample, --, therefor.

Signed and Sealed this
Twenty-fourth Day of April, 2012

David J. Kappos
*Director of the United States Patent and Trademark Office*